(12) United States Patent
An

(10) Patent No.: US 10,276,599 B2
(45) Date of Patent: Apr. 30, 2019

(54) DISPLAY PANEL AND FAN-OUT CIRCUIT STRUCTURE THEREOF

(71) Applicant: Shenzhen China Star Optoelectronics Technology Co., Ltd., Shenzhen, Guangdong (CN)

(72) Inventor: Liyang An, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/572,835

(22) PCT Filed: Jun. 9, 2017

(86) PCT No.: PCT/CN2017/087782
§ 371 (c)(1),
(2) Date: Nov. 9, 2017

(87) PCT Pub. No.: WO2018/196110
PCT Pub. Date: Nov. 1, 2018

(65) Prior Publication Data
US 2018/0308865 A1 Oct. 25, 2018

(30) Foreign Application Priority Data
Apr. 25, 2017 (CN) .......................... 2017 1 0278353

(51) Int. Cl.
*H01L 27/12* (2006.01)
*G02F 1/1345* (2006.01)
*G02F 1/1362* (2006.01)

(52) U.S. Cl.
CPC ........ *H01L 27/124* (2013.01); *G02F 1/13458* (2013.01); *G02F 1/136286* (2013.01); *G02F 2001/13629* (2013.01); *G02F 2201/123* (2013.01); *G09G 2300/0426* (2013.01)

(58) Field of Classification Search
CPC .......................... H01L 27/124; H01L 27/1248
See application file for complete search history.

(56) References Cited

U.S. PATENT DOCUMENTS

2017/0318685 A1* 11/2017 Chen ...................... H05K 3/429

\* cited by examiner

*Primary Examiner* — Quoc D Hoang
(74) *Attorney, Agent, or Firm* — Mark M. Friedman

(57) ABSTRACT

A fan-out circuit structure, a display panel, and a display device are provided. The fan-out circuit structure includes: a first metal layer, a second metal layer, and a third metal layer, wherein the first metal layer includes a first metal sub-layer and a second metal sub-layer; the third metal layer includes a third metal sub-layer and a fourth metal sub-layer; the first metal sub-layer is connected with a first end of the second metal layer through the third metal sub-layer; and a second end of the second metal layer is connected with the second metal sub-layer through the fourth metal sub-layer.

10 Claims, 2 Drawing Sheets

DISPLAY PANEL AND FAN-OUT CIRCUIT STRUCTURE THEREOF

FIELD OF THE INVENTION

The present disclosure relates to a field of liquid crystal displays, and more particularly to a display panel and a fan-out circuit structure therefore.

BACKGROUND OF THE INVENTION

Liquid crystal display devices (LCDs) have been developed for decades, wherein a vertical alignment (VA) display mode has become a common display mode of TFT-LCD for large size TVs. Products having a large size and high pixels per inch (PPI) are desired in the field. However, the products are limited by size, boarder, and panel utilization, so that it is difficult to design a fan-out circuit layout having equal resistance. Generally, panel signals are provided by a plurality of COFs (chip on flex, or chip on film), wherein each of the COFs is responsible for signals in a region, and the signals are inputted to a panel through a fan-out circuit which is connected with the COF. Resistance close to two side edges of the fan-out circuit is greater, and resistance close to a middle area of the fan-out circuit is smaller. Because of the different resistances in the fan-out circuit, circuit signals which are inputted to the panel through a fan-out circuit have different degrees of attenuation, wherein signals close to the two side edges are seriously distorted, but signals close to the middle area are perfect by contrast. Since the signals are different in different locations, vertical bright/dark band display defects are easily produced when the panel displays images, so that the class and the price of the product is lowered.

Hence, it is necessary to improve the defect existing in the conventional technology.

SUMMARY OF THE INVENTION

The object of the present disclosure is to provide a fan-out circuit structure and a display panel, so as to solve a problem: in the conventional technology, because resistance values of the fan-out circuit are different, different signal delays influence the display quality.

For solving the above-mention problem, the present disclosure provides technical solutions as follows:

The present disclosure provides a fan-out circuit structure, which comprises: a first metal layer, a second metal layer, and a third metal layer insulatively stacked with each other, wherein the first metal layer includes a first metal sub-layer and a second metal sub-layer spaced from each other; the third metal layer includes a third metal sub-layer and a fourth metal sub-layer spaced from each other; the first metal sub-layer is connected with a first end of the second metal layer through the third metal sub-layer; and a second end of the second metal layer is connected with the second metal sub-layer through the fourth metal sub-layer.

In the fan-out circuit structure of the present disclosure, the first metal layer, the second metal layer, and the third metal layer are insulatively stacked with each other from bottom to top; a first insulating layer is disposed between the first metal layer and the second metal layer; a second insulating layer is disposed between the second metal layer and the third metal layer; the fan-out circuit structure further includes at least one first via which passes through the first insulating layer and the second insulating layer, and two second vias which pass through the second insulating layer; a first end of the third metal sub-layer is connected with the first metal sub-layer through the first via; a second end of the third metal sub-layer is connected with the first end of the second metal layer through one of the second vias; the second end of the second metal layer is connected with a first end of the fourth metal sub-layer through the other of the second vias; and the fourth metal sub-layer is connected with the second metal sub-layer.

In the fan-out circuit structure of the present disclosure, there are two of the first vias; the first metal sub-layer has two first connecting branches; the third metal sub-layer of the third metal layer has two third connecting branches; and the two third connecting branches are connected with the two first connecting branches through the two first vias, respectively.

In the fan-out circuit structure of the present disclosure, the fan-out circuit structure has a third via, and the fourth metal sub-layer is connected with the second metal sub-layer through the third via.

In the fan-out circuit structure of the present disclosure, the fourth metal sub-layer has a main body and two connecting ends on the two ends of the main body; one of the connecting ends is connected with the second metal layer; the other of the connecting ends is connected with the second metal sub-layer; the main body and the second metal sub-layer are on the same level plane; and a third insulating layer is disposed between the main body and the first metal sub-layer.

In the fan-out circuit structure of the present disclosure, the first metal layer is a gate electrode layer; the second metal layer is a source electrode layer; and the third metal layer is a pixel electrode layer.

In the fan-out circuit structure of the present disclosure, a resistance value of the fan-out circuit structure is adjustable according to a distance between the first via and the second via to change a length of the third metal layer and/or a length of the second metal layer; or the resistance value of the fan-out circuit structure is adjustable according to a distance between two of the second vias to change a length of the third metal layer and/or a length of the second metal layer.

In the fan-out circuit structure of the present disclosure, a resistance value of the fan-out circuit structure is adjustable according to a width of the second metal layer and a width of the third metal layer.

In the fan-out circuit structure of the present disclosure, a resistance value of the fan-out circuit structure is adjustable according to a width of the second metal layer or a width of the third metal layer.

The present disclosure further provides a display panel, which comprises: a wire pad region, a plurality of control wires, and a fan-out circuit assembly, wherein one end of the fan-out circuit assembly is connected with wire pads; an opposite end of the fan-out circuit assembly is connected with the control wires; and the fan-out circuit assembly includes a plurality of the above-mentioned fan-out circuit structures.

Compared with the conventional technology, the fan-out circuit structure of the present disclosure is constructed by the three metal layers, and the three metal layers are stacked with each other. The resistance value of the fan-out circuit structure can be adjusted by adjusting the length and/or the width of the second metal layer, and/or the length and/or the width of the third metal layer, so as to reduce the difference of the resistance values caused by the difference in the length of the inside wires, so that an inside signal delay of the panel is uniform to a certain degree, and a vertical bright/dark band does not appear.

DETAILED DESCRIPTION OF THE PREFERRED EMBODIMENTS

Figure 1:
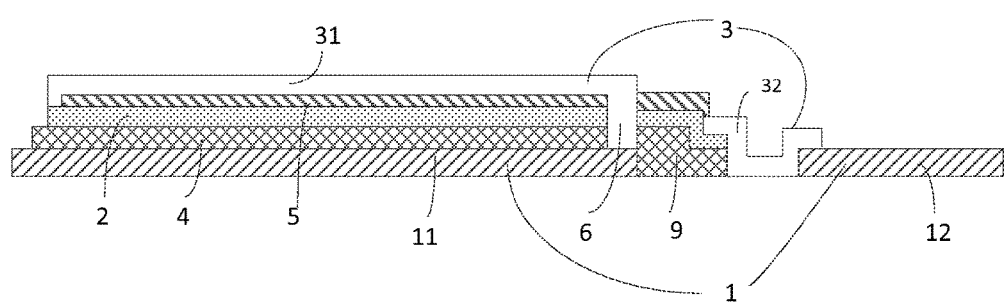
FIG. 1 is a cross-sectional view of a fan-out circuit structure according to a preferable embodiment of the present disclosure.

The foregoing objects, features, and advantages adopted by the present disclosure can be best understood by referring to the following detailed description of the preferred embodiments and the accompanying drawings. Furthermore, the directional terms described in the present disclosure, such as upper, lower, front, rear, left, right, inside, outer, side, etc., are only directions with reference to the accompanying drawings, so that the used directional terms are used to describe and understand the present disclosure, but the present disclosure is not limited thereto.

In the drawings, units with similar structures use the same numerals.

Referring now to FIG. 1, which is a cross-sectional view of a fan-out circuit structure according to a preferable embodiment of the present disclosure. A fan-out circuit structure comprises a first metal layer 1, a second metal layer 2, and a third metal layer 3 insulatively stacked with each other, wherein the first metal layer 1 includes a first metal sub-layer 11 and a second metal sub-layer 12 spaced from each other. The third metal layer 3 includes a third metal sub-layer 31 and a fourth metal sub-layer 32 spaced from each other. The first metal sub-layer 11 is connected with a first end of the second metal layer 2 through the third metal sub-layer 31 of the third metal layer 3, and a second end of the second metal layer 2 is connected with the second metal sub-layer 12 of the first metal layer 1 through the fourth metal sub-layer 32 of the third metal layer 3. Specifically, a resistance value of the fan-out circuit structure is adjusted by adjusting parameters of the second metal layer 2 and/or the third metal layer 3. Specifically, the parameters at least include a length and a width of the corresponding metal layer.

For example, the resistance value of the fan-out circuit structure can be adjusted by adjusting a length and/or a width of the second metal layer 2; or the resistance value of the fan-out circuit structure can be adjusted by adjusting a length and/or a width of the third metal layer 3; or the resistance value of the fan-out circuit structure can be adjusted by adjusting a length and/or a width of the second metal layer 2 and a length and/or a width of the third metal layer 3. Also, there are other options, for example, the resistance value of the fan-out circuit structure can be adjusted by adjusting a length of the second metal layer 2 and/or a length of the third metal layer 3; or the resistance value of the fan-out circuit structure can be adjusted by adjusting a width of the second metal layer 2 and/or a width of the third metal layer 3, but the present disclosure is not limited thereto.

In one preferable option of the embodiment, the first metal layer 1, the second metal layer 2, and the third metal layer 3 are insulatively stacked with each other from bottom to top; and a first insulating layer 4 is disposed between the first metal layer 1 and the second metal layer 2; a second insulating layer 5 is disposed between the second metal layer 2 and the third metal layer 3.

Furthermore, the fan-out circuit structure further includes at least one first via 6 which passes through the first insulating layer 4 and the second insulating layer 5; and two second vias 7 which pass through the second insulating layer 5; wherein a first end of the third metal sub-layer 31 of the third metal layer 3 is connected with the first metal sub-layer 11 of the first metal layer 1 through the first via 6; a second end of the third metal sub-layer 31 of the third metal layer 3 is connected with the first end of the second metal layer 2 through one of the second vias 7; the second end of the second metal layer 2 is connected with a first end of the fourth metal sub-layer 32 of the third metal layer 3 through the other of the second vias 7; and the fourth metal sub-layer 32 of the third metal layer 3 is connected with the second metal sub-layer 12 of the first metal layer 1.

In one preferable option of the embodiment, the resistance value of the fan-out circuit structure is adjusted by adjusting a distance between the first via 6 and the second via 7 to change a length of the third metal layer 3 and/or a length of the second metal layer 2; or the resistance value of the fan-out circuit structure is adjusted by adjusting a distance between two of the second vias 7 to change a length of the third metal layer 3 and/or a length of the second metal layer 2. In one preferable option of the embodiment, there are two of the first vias 6 disposed at two sides of the third metal layer 3, respectively. Preferably, the two first vias 6 are symmetrically disposed at two sides of the third metal layer 3 (a connecting line of the two first vias 6 is perpendicular to a straight line of the third metal layer 3); the first metal sub-layer 11 of the first metal layer 1 has two first connecting branches (not shown in the figures); the third metal sub-layer 31 of the third metal layer 3 has two third connecting branches (not shown in the figures); and the two third connecting branches are connected with the two first connecting branches through the two first vias 6, respectively. The first vias 6 pass through the first insulating layer 4 and the second insulating layer 5, and is disposed at two sides of the third metal layer 3, so that an electrical connection can bypass the third metal layer 3.

Figure 2:
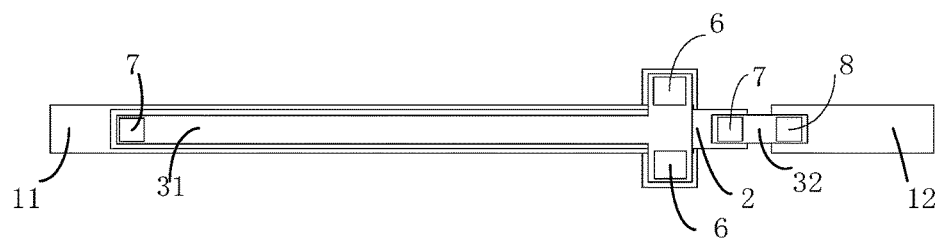
FIG. 2 is a plan view of a fan-out circuit structure according to a preferable embodiment of the present disclosure.

Furthermore, the fan-out circuit structure further includes a third via 8, and the fourth metal sub-layer 32 of the third metal layer 3 is connected with the second metal sub-layer 12 of the first metal layer 1 through the third via 8 (as shown in FIG. 2).

In one preferable option of the embodiment, the fourth metal sub-layer 32 of the third metal layer 3 has a main body and two connecting ends on the two ends of the main body (not shown in the figures), one of the connecting ends is connected with the second metal layer 2; the other of the connecting ends is connected with the second metal sub-layer 12 of the first metal layer 1; the main body and the second metal sub-layer 21 of the first metal layer 1 are on the same level plane; and a third insulating layer 9 is disposed between the main body and the first metal sub-layer 11 of the first metal layer 1, so as the third insulating layer 9 can isolate the first metal layer 1 and the third metal layer 3.

Preferably, the first metal layer 1 is a gate electrode layer (M1); the second metal layer 2 is a source electrode layer (M2); and the third metal layer 3 is a pixel electrode layer (indium tin oxide electrode layer; ITO electrode layer).

Figure 4:
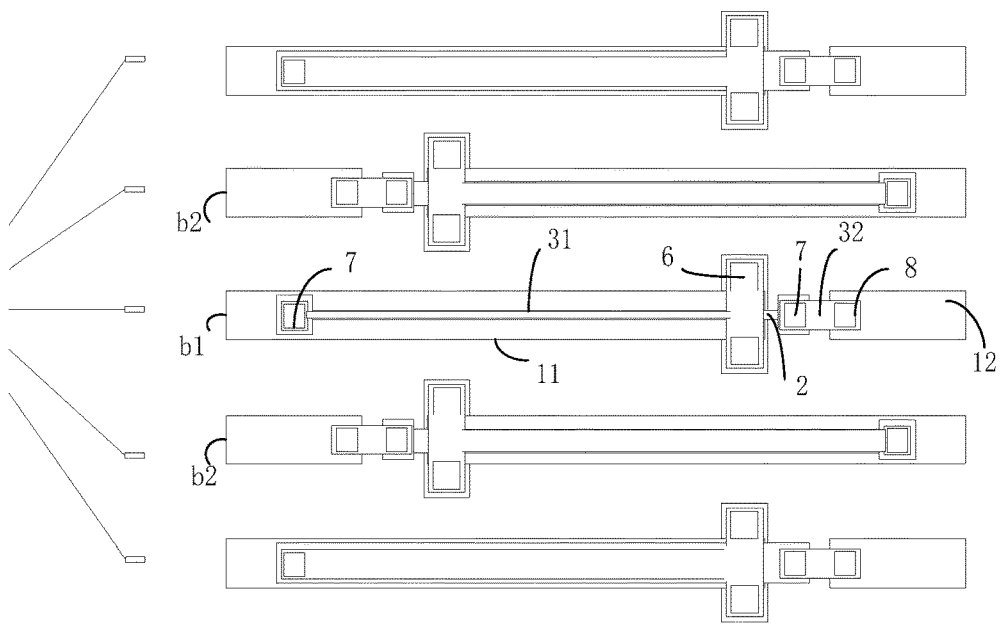
FIG. 4 is a schematic view of another fan-out circuit assembly of a display panel according to a preferable embodiment of the present disclosure.

In another preferable option of the embodiment, the resistance value of the fan-out circuit structure can be adjusted by adjusting a width of the second metal layer 2 and/or a width of the third metal layer 3. For example, when the width of the second metal layer 2 is small, the resistance value of the fan-out circuit structure will be great. Specifically, this can be accomplished by adjusting a width of a part of the structure of the third metal layer 3. As shown in FIG. 4, the width of the second metal layer 2 is equal to the width of the third metal sub-layer 31 of the third metal layer 3, and is less than the width of the fourth metal sub-layer 32 of the third metal layer 3.

In the embodiment, the above-mentioned parameters can correspond to materials of the metal layers (such as electric resistance rate and electric conductivity rate of the materials). For example, the required resistance value can be obtained by changing material of the source electrode and/or material of the ITO electrode layer, or the required resistance value can be obtained by changing a length and a width of the source electrode and/or a length and a width of the ITO electrode layer, wherein the width of the source electrode can be greater than or equal to the width of the ITO electrode layer. In a further preferable option of the embodiment, the width of the source electrode is equal to the width of the ITO electrode layer.

In another preferable option of the embodiment, in an whole consideration, the resistance value of the fan-out circuit structure can be adjusted by adjusting a length and a width of the second metal layer 2 and/or a length and a width of the third metal layer 3. For example, if the resistance value of the fan-out circuit structure needs to be increased, it can be accomplished by extending the length of the second metal layer 2 and/or a length of the third metal layer 3, and reducing a width of the corresponding metal layer at the same time.

In the embodiment, the fan-out circuit structure is constructed by the three metal layers, and the three metal layers are stacked with each other. The resistance value of the fan-out circuit structure can be adjusted by adjusting the parameters of the second metal layer 2 and/or the parameters of the third metal layer 3, so as to reduce the difference of the resistance values caused by the difference in the length of the inside wires, so that an inside signal delay of the panel is uniform to a certain degree, and a vertical bright/dark band doesn't appear.

The present disclosure further provides a display panel, and the display panel at least includes a wire pad region (not shown in the figures), a fan-out circuit assembly, and a plurality of control wires, wherein the control wires are arranged in parallel and connected to a plurality of corresponding thin-film transistors; the fan-out circuit assembly is configured to connect the control wires to a plurality of wire pads in the wire pad region. The wire pad region is configured to install a control integrated circuit, so that the control integrated circuit can transfer control signals to the corresponding thin-film transistors through the fan-out circuit assembly and the control wires.

Figure 3:
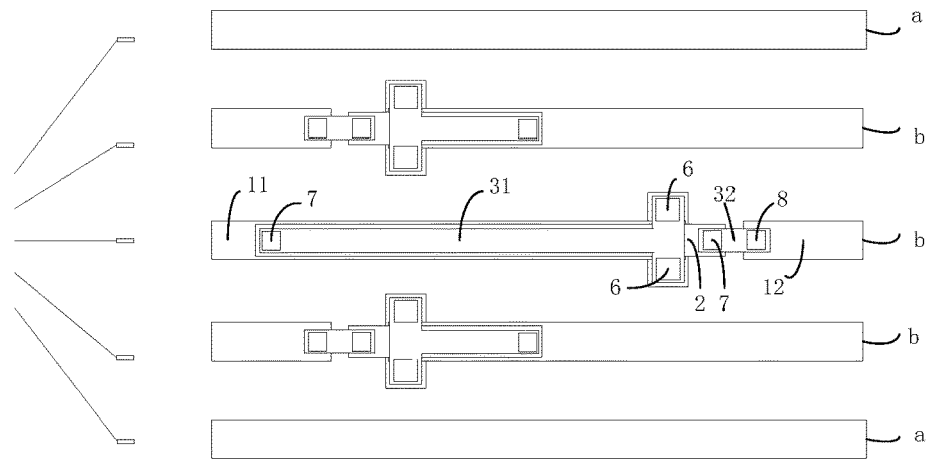
FIG. 3 is a schematic view of a fan-out circuit assembly of a display panel according to a preferable embodiment of the present disclosure.

As shown in FIG. 3, which is a schematic view of a fan-out circuit assembly of a display panel according to a preferable embodiment of the present disclosure, the fan-out circuit assembly includes a plurality of fan-out circuit structures b and at least two metal circuits a, wherein the fan-out circuit structures b are disposed in an inside area of a fan-out area where the fan-out circuit assembly is located, and the at least two metal circuits are disposed in two side edges of the fan-out area. A length of the metal circuit is greater than a distance of the fan-out circuit structure, from the wire pad region to the control wires. A specific structure, technical effect, and operating principle of the fan-out circuit structure is basically the same as the above-mentioned embodiments, so refer to the description of the above-mentioned embodiments, it is not repeated here.

In one preferable option of the embodiment, the fan-out circuit structures are disposed in the fan-out area, and the direction of two of the adjacent fan-out circuit structures are inverse. Specifically, in one of the fan-out circuit structures, the first metal sub-layer 11 of the first metal layer 1 is connected to the wire pad, and the second metal sub-layer 12 is connected to the control wire; but in another fan-out circuit structure, the first metal sub-layer 11 of the first metal layer 1 is connected to the control wire, and the second metal sub-layer 12 is connected to the wire pad.

In a further preferable option of the embodiment, as shown in FIG. 4, in two of the adjacent fan-out circuit structures (b1, b2), a width of the second metal layer of the fan-out circuit structures b1, which is close to the middle area of the fan-out circuit assembly, is less than a width of the second metal layer of the fan-out circuit structures b2, which is far away from the middle area of the fan-out circuit assembly. A width of the third metal layer of the fan-out circuit structures b1, which is close to the middle area of the fan-out circuit assembly, is less than a width of the third metal layer of the fan-out circuit structures b2, which is far away from the middle area of the fan-out circuit assembly.

In the embodiment, the width of the metal layer of the fan-out circuit structures in the middle area is less than the width of the metal layer of the fan-out circuit structures in the two sides areas, namely a resistance of the two sides is greater than a resistance of the middle area, the resistance can be compensated by the width of the metal layer of the fan-out circuit structures in the inside area, so that the resistance values of the fan-out circuit structures in the fan-out area are uniform, so as to reduce the difference of the resistance values caused by the difference in the length of the COF inside wires.

In a further preferable option of the embodiment, a width of the first metal layer 1, the second metal layer 2, and the third metal layer 3 are identical.

In a further preferable option of the embodiment, a width of the second metal layer 2 and the third metal layer 3 are identical, and are less than a width of the first metal layer 1.

In the embodiment, a resistance of the two sides is greater than a resistance of the middle area. The resistance can be compensated by disposing three metal layers in an inside area (excluding the two sides), so that the resistance values of the fan-out circuit structures are uniform, so as to make uniform an inside signal delay of the panel to a certain degree, and improve the display quality.

It should be noted that the resistance values of the corresponding fan-out circuit structures can be adjusted by controlling the lengths of the second metal layer and the third metal layer, so that in the fan-out structures, from the two sides of the fan-out area to the middle area of the fan-out area, the lengths of the second metal layer and/or the lengths of the third metal layer are increased, so as to accomplished the uniformity of the fan-out structures in the fan-out area.

The present disclosure further provides a display device, the display device includes the above-mentioned display panel, a specific structure and technical effect of the fan-out circuit structure is basically the same as the above-mentioned embodiments, so refer to the above-mentioned embodiments, it is not repeated here.

In the embodiment, the fan-out circuit structure is constructed by the three metal layers, and the three metal layers are stacked with each other. The resistance value of the fan-out circuit structure can be adjusted by adjusting the parameters of the second metal layer 2 and/or the parameters of the third metal layer 3, so as to reduce the difference of resistance values caused by the difference in the length of the inside wires, so that an inside signal delay of the panel is uniform to a certain degree, and a vertical bright/dark band does not appear.

The present disclosure has been described with preferred embodiments thereof and it is understood that many changes and modifications to the described embodiment can be carried out without departing from the scope and the spirit of the invention that is intended to be limited only by the appended claims.

What is claimed is:

1. A fan-out circuit structure of a display panel, comprising:
   a first metal layer, a second metal layer, and a third metal layer insulatively stacked with each other, wherein the first metal layer includes a first metal sub-layer and a second metal sub-layer spaced from each other; the third metal layer includes a third metal sub-layer and a fourth metal sub-layer spaced from each other; the first metal sub-layer is connected with a first end of the second metal layer through the third metal sub-layer; and a second end of the second metal layer is connected with the second metal sub-layer through the fourth metal sub-layer;
   wherein the first metal layer, the second metal layer, and the third metal layer are insulatively stacked with each other from bottom to top; a first insulating layer is disposed between the first metal layer and the second metal layer; a second insulating layer is disposed between the second metal layer and the third metal layer; the fan-out circuit structure further includes at least one first via which passes through the first insulating layer and the second insulating layer, and two second vias which pass through the second insulating layer; a first end of the third metal sub-layer is connected with the first metal sub-layer through the first via; a second end of the third metal sub-layer is connected with the first end of the second metal layer through one of the second vias; the second end of the second metal layer is connected with a first end of the fourth metal sub-layer through the other of the second vias; and the fourth metal sub-layer is connected with the second metal sub-layer.

2. The fan-out circuit structure according to claim 1, wherein there are two of the first vias; the first metal sub-layer has two first connecting branches; the third metal sub-layer of the third metal layer has two third connecting branches; and the two third connecting branches are connected with the two first connecting branches through the two first vias, respectively.

3. The fan-out circuit structure according to claim 2, wherein the fan-out circuit structure has a third via, and the fourth metal sub-layer is connected with the second metal sub-layer through the third via.

4. The fan-out circuit structure according to claim 3, wherein the fourth metal sub-layer has a main body and two connecting ends on the two ends of the main body; one of the connecting ends is connected with the second metal layer; the other of the connecting ends is connected with the second metal sub-layer; the main body and the second metal sub-layer are on the same level plane; and a third insulating layer is disposed between the main body and the first metal sub-layer.

5. The fan-out circuit structure according to claim 4, wherein the first metal layer is a gate electrode layer; the second metal layer is a source electrode layer; and the third metal layer is a pixel electrode layer.

6. The fan-out circuit structure according to claim 1, wherein a resistance value of the fan-out circuit structure is adjustable according to a distance between the first via and the second via to change a length of the third metal layer and/or a length of the second metal layer; or the resistance value of the fan-out circuit structure is adjustable according to a distance between two of the second vias to change a length of the third metal layer and/or a length of the second metal layer.

7. The fan-out circuit structure according to claim 1, wherein a resistance value of the fan-out circuit structure is adjustable according to a width of the second metal layer and a width of the third metal layer.

8. The fan-out circuit structure according to claim 1, wherein a resistance value of the fan-out circuit structure is adjustable according to a width of the second metal layer or a width of the third metal layer.

9. A display panel, comprising: a wire pad region, a plurality of control wires, and a fan-out circuit assembly, wherein one end of the fan-out circuit assembly is connected with the wire pad region; an opposite end of the fan-out circuit assembly is connected with the control wires; and the fan-out circuit assembly includes a plurality of the fan-out circuit structures according to claim 1.

10. A fan-out circuit structure of a display panel, comprising:
   a first metal layer, a second metal layer, and a third metal layer insulatively stacked with each other, wherein the first metal layer includes a first metal sub-layer and a second metal sub-layer spaced from each other; the third metal layer includes a third metal sub-layer and a fourth metal sub-layer spaced from each other; the first metal sub-layer is connected with a first end of the second metal layer through the third metal sub-layer; and a second end of the second metal layer is connected with the second metal sub-layer through the fourth metal sub-layer;
   wherein the first metal layer, the second metal layer, and the third metal layer are insulatively stacked with each other from bottom to top; a first insulating layer is disposed between the first metal layer and the second metal layer; a second insulating layer is disposed between the second metal layer and the third metal layer; the fan-out circuit structure further includes at least one first via which passes through the first insulating layer and the second insulating layer, and two second vias which pass through the second insulating layer; a first end of the third metal sub-layer is connected with the first metal sub-layer through the first via; a second end of the third metal sub-layer is connected with the first end of the second metal layer through one of the second vias; the second end of the second metal layer is connected with a first end of the fourth metal sub-layer through the other of the second vias; and the fourth metal sub-layer is connected with the second metal sub-layer;
   wherein there are two of the first vias; the first metal sub-layer has two first connecting branches; the third metal sub-layer of the third metal layer has two third connecting branches; and the two third connecting branches are connected with the two first branches through the two first vias, respectively;

wherein the fan-out circuit structure has a third via, and the fourth metal sub-layer is connected with the second metal sub-layer through the third via;

wherein the fourth metal sub-layer has a main body and two connecting ends on the two ends of the main body; one of the connecting ends is connected with the second metal layer; the other of the connecting ends is connected with the second metal sub-layer; the main body and the second metal sub-layer are on the same level plane; and a third insulating layer is disposed between the main body and the first metal sub-layer; and wherein a resistance value of the fan-out circuit structure is adjustable according to a distance between the first via and the second via to change a length of the third metal layer and/or a length of the second metal layer; or the resistance value of the fan-out circuit structure is adjustable according to a distance between two of the second vias to change a length of the third metal layer and/or a length of the second metal layer.

\* \* \* \* \*